US009530616B2

(12) United States Patent
Yamashita et al.

(10) Patent No.: US 9,530,616 B2
(45) Date of Patent: Dec. 27, 2016

(54) BLANKING APERTURE ARRAY AND CHARGED PARTICLE BEAM WRITING APPARATUS

(71) Applicant: NuFlare Technology, Inc., Yokohama-shi (JP)

(72) Inventors: Hiroshi Yamashita, Sagamihara (JP); Hiroshi Matsumoto, Yokohama (JP); Kazuhiro Chiba, Sagamihara (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 14/857,095

(22) Filed: Sep. 17, 2015

(65) Prior Publication Data

US 2016/0099129 A1    Apr. 7, 2016

(30) Foreign Application Priority Data

Oct. 3, 2014   (JP) ................... 2014-204873

(51) Int. Cl.
*G21K 5/04* (2006.01)
*H01J 37/317* (2006.01)

(52) U.S. Cl.
CPC .... *H01J 37/3174* (2013.01); *H01J 2237/0435* (2013.01); *H01J 2237/31774* (2013.01)

(58) Field of Classification Search
USPC ............... 250/396 R, 397, 492.1, 492.2, 492.21, 250/492.22, 492.23, 492.3
See application file for complete search history.

(56) References Cited

U.S. PATENT DOCUMENTS

| 6,617,595 | B1* | 9/2003 | Okunuki | G21K 1/08 250/398 |
| 2002/0005491 | A1* | 1/2002 | Yagi | B82Y 10/00 250/396 ML |
| 2008/0203317 | A1* | 8/2008 | Platzgummer | B82Y 10/00 250/396 R |
| 2013/0206999 | A1* | 8/2013 | Shimazu | H01J 37/12 250/396 R |

FOREIGN PATENT DOCUMENTS

| JP | 2001-319854 | 11/2001 |
| JP | 4704702 | 6/2011 |
| JP | 5565684 | 8/2014 |

* cited by examiner

*Primary Examiner* — Nicole Ippolito
(74) *Attorney, Agent, or Firm* — Oblon, McClelland, Maier & Neustadt, L.L.P.

(57) ABSTRACT

In one embodiment, a blanking aperture array includes a substrate including an upper surface on which an insulating film is provided, a plurality of blanking aperture portions provided in the substrate, each of the plurality of blanking aperture portions including one of penetration holes, through which a predetermined beam passes, and one of blanking electrodes and one of ground electrodes which are provided on the insulating film, and the blanking electrodes and the ground electrodes configured to perform blanking deflection of the predetermined beam, and a high-resistivity film provided so as to cover the insulating film and at least part of the ground electrodes, the high-resistivity film having an electric resistance that is higher than an electric resistance of the ground electrodes and lower than an electric resistance of the insulating film.

18 Claims, 4 Drawing Sheets

BLANKING APERTURE ARRAY AND CHARGED PARTICLE BEAM WRITING APPARATUS

CROSS REFERENCE TO RELATED APPLICATION

This application is based upon and claims benefit of priority from the Japanese Patent Application No. 2014-204873, filed on Oct. 3, 2014, the entire contents of which are incorporated herein by reference.

FIELD

The present invention relates to a blanking aperture array and a charged particle beam writing apparatus.

BACKGROUND

With an increase in the density of LSI, the circuit line width of semiconductor devices has decreased through the years. To form a desired circuit pattern of semiconductor devices on a wafer, an original image pattern (i.e., a mask or, particularly, a reticle for use in steppers or scanners) with high precision formed on a quartz mask blank is transferred onto a wafer with its size reduced by using reduction projection light-exposure apparatus. The original image pattern with high precision is written by an electron beam writing apparatus, i.e., with a so-called electron beam lithography technique.

Examples of the electron beam writing apparatus include a multi-beam writing apparatus with an increased throughput by applying a large number of beams at a time with a multi-beam technique. In this multi-beam writing apparatus, for example, multiple beams are formed by letting an electron beam emitted from an electron gun pass through an aperture member having a plurality of apertures, and blanking control is performed for each of the beams by a blanking aperture array. Unblocked beams are diminished in an optical system and applied onto a desired location on a mask blank to be written.

The blanking aperture array includes a substrate in which multiple holes are formed, blankers formed around the respective holes, and a control circuit that applies a voltage to the blankers. Normally, after MOS field-effect transistors (MOSFET) constituting the control circuit are formed, a passivation film (protection film) made of, for example, a silicon nitride film is formed on the surface of the substrate. Thus, an insulator film such as a silicon nitride film is exposed on the surface of the blanking aperture array. When the blanking aperture array is irradiated with an electron beam and/or electrons scattered by an aperture, the surface of the blanking aperture array is electrically charged. This may cause the following problems. The gate insulator of the MOSFET may be subjected to an electrostatic breakdown, failing to perform blanking control. The courses of beams that pass through the holes may be deflected by the electric field, causing deviation of trajectory (irradiation positions on a blank) or defocus, thereby reducing drawing accuracy.

DETAILED DESCRIPTION

In one embodiment, a blanking aperture array includes a substrate including an upper surface on which an insulating film is provided, a plurality of blanking aperture portions provided in the substrate, each of the plurality of blanking aperture portions including one of penetration holes, through which a predetermined beam passes, and one of blanking electrodes and one of ground electrodes which are provided on the insulating film, and the blanking electrodes and the ground electrodes configured to perform blanking deflection of the predetermined beam, and a high-resistivity film provided so as to cover the insulating film and at least part of the ground electrodes, the high-resistivity film having an electric resistance that is higher than an electric resistance of the ground electrodes and lower than an electric resistance of the insulating film.

Embodiments of the present invention will be described hereinafter with reference to the drawings.

Figure 1:
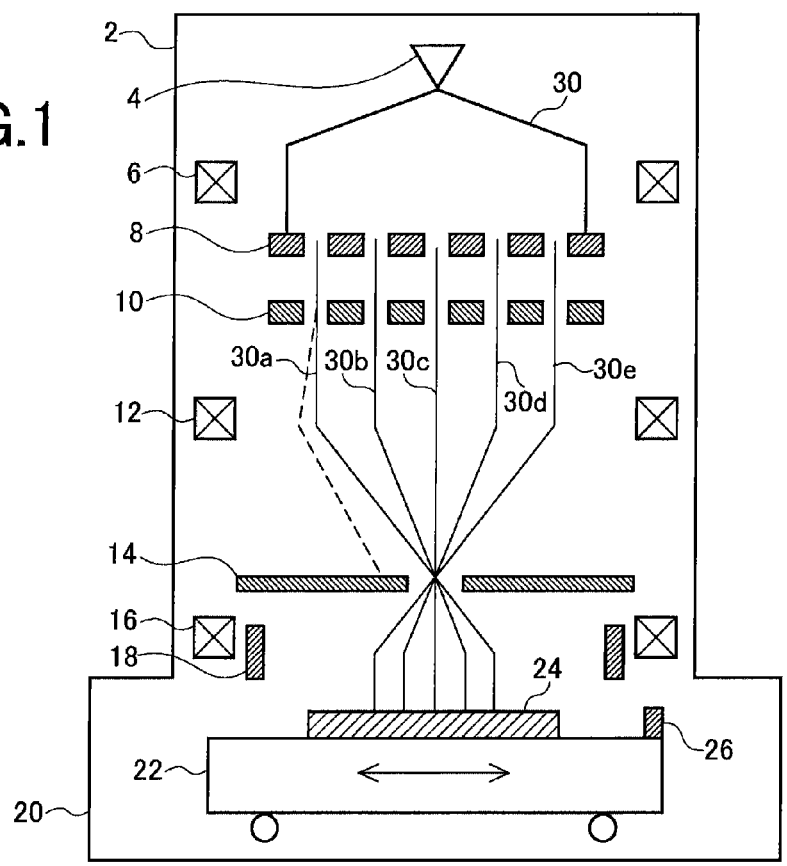
FIG. 1 schematically illustrates a charged particle beam writing apparatus according to an embodiment of the present invention.

FIG. 1 schematically illustrates a charged particle beam writing apparatus attached with a blanking aperture array according to the embodiment. Here, a configuration using an electron beam as an example of a charged particle beam will be described. The charged particle beam is not limited to an electron beam and may be another charged particle beam such as an ion beam.

An electron beam writing apparatus illustrated in FIG. 1 includes an electron beam barrel 2 and a writing chamber 20. The electron beam barrel 2 houses an electron gun 4, an illuminating lens 6, an aperture member 8, a blanking aperture array 10, a reducing lens 12, a limiting aperture member 14, an objective lens 16, and a deflector 18. The writing chamber 20 contains an XY stage 22. A mask blank 24 serving as a writing object substrate is placed on the XY stage 22. Examples of the object include a wafer, a substrate for nanoimprint lithography, and a mask on which a pattern has been already formed.

For example, a Levenson phase-shifting mask requires two writing operations. Thus, a second pattern can be written on an object which has been written and processed as a mask, in some cases. A mirror 26 for positioning the XY stage 22 is also placed on the XY stage 22.

Figure 2:
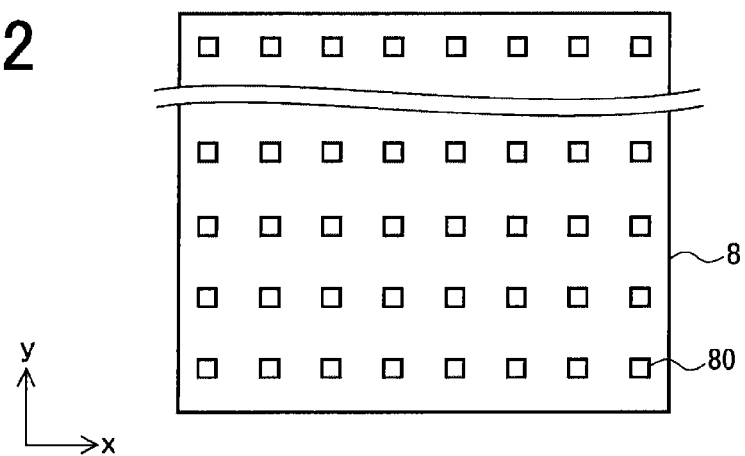
FIG. 2 schematically illustrates a configuration of an aperture member.

An electron beam 30 emitted from the electron gun 4 perpendicularly or substantially perpendicularly illuminates the entire aperture member 8 as an object surface with the illuminating lens 6. FIG. 2 is a conceptual illustration of a configuration of the aperture member 8. The aperture member 8 has apertures (openings) 80 that are arranged in matrix of m columns (in a y-direction) and n rows (in an x-direction) (where m, n≥2) at a predetermined arrangement pitch. For example, apertures 80 in 512×8 columns are formed. The apertures 80 are of the same rectangular shape with the same dimensions. The apertures 22 may be of the same circular shape with the same outer diameter.

The electron beam 30 illuminates a region on the aperture member 8 including all the apertures 80. Part of the electron beam 30 passes through the apertures 80, thereby forming multi-beams 30a to 30e as illustrated in FIG. 1.

In FIG. 2, the apertures 80 are arranged in two or more rows and two or more columns (in x- and y-directions). However, the present invention is not limited to this example. For example, a configuration in which either rows or columns (in x- or y-direction) are plural and the other is singular may be employed. As illustrated in FIG. 2, the arrangement of the apertures 80 is not limited to a lattice pattern with rows and columns. For example, vertically adjacent apertures may be alternately arranged in a staggered pattern.

As described below, the blanking aperture array 10 has penetration holes (penetration holes 110 shown in FIGS. 4 and 5) whose locations coincide with the locations of the apertures 80 in the aperture member 8. Blankers of a pair of two electrodes (blankers 101 including a ground electrode 102 and a blanking electrode 104 shown in FIG. 5) are disposed at each of the penetration holes. The electron beams 30a to 30e passing through the penetration holes are deflected independently of each other by voltages (i.e. electric field) applied from the blankers. The blanking control is performed with this deflection. In this manner, the blanking aperture array 10 performs blanking deflection on corresponding beams of the multi-beams that have passed through the apertures 80 in the aperture member 8.

The size and pitch of the multi-beams 30a to 30e that have passed through the blanking aperture array 10 are reduced by the reducing lens 12 and go toward a center hole in the limiting aperture member 14 provided in the crossover. The electron beams deflected by the blankers of the blanking aperture array 10 deviate from the center hole in the limiting aperture member 14 and are blocked by the limiting aperture member 14. On the other hand, electron beams not deflected by the blankers of the blanking aperture array 10 pass through the center hole in the limiting aperture member 14.

In this manner, the limiting aperture member 14 blocks deflected beams so as to turn the beams off with the electrodes of the blanking aperture array 10. Beams that have passed through the limiting aperture member 14 from when the beams are turned on to when the beams are turned off serve as beams corresponding to one shot. The multi-beams 30a to 30e that have passed through the limiting aperture member 14 are focused by the objective lens 16. Finally, the figure of the aperture 80 which is the object surface is transferred onto the mask blank 24 which is an image surface with its size reduced. The beams (entire multi-beams) that have passed through the limiting aperture member 14 are deflected in the same direction by the deflector 18 and applied to the corresponding locations on the mask blank 24.

Multi-beams applied at a time are ideally arranged at a pitch obtained by multiplying the arrangement pitch of apertures 80 in the aperture member 8 by the desired reduction ratio described above. The writing apparatus performs writing operation with a raster scan technique in which shot beams are consecutively applied, and in writing a desired pattern, necessary beams are controlled to be on by blanking control in accordance with the pattern. While the XY stage 22 continuously moves, the locations onto which the beams are applied are controlled by the deflector 18 such that the locations follow the movement of the XY stage 22.

The electron beam writing apparatus is controlled by a controller (not shown). The controller subjects write data to a multi-stage data conversion process, thus generating shot data specific to the apparatus. In the shot data, for example, an amount of radiation for each shot and the coordinates of each irradiation position are defined. The controller divides the amount of radiation by a current density, thus obtaining irradiation time t. To achieve each shot, the controller applies a deflection voltage to the blankers, associated with the shot, in the blanking aperture array 10 so that the blankers provide the beam-ON mode only for the irradiation time t.

In addition, the controller calculates an amount of deflection and applies a deflection voltage to the deflector 18. Consequently, the multiple beams corresponding to a shot at that time are collectively deflected.

Figure 3:
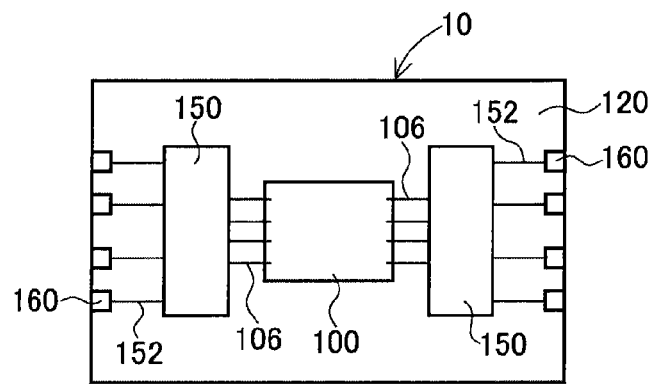
FIG. 3 schematically illustrates a configuration of a blanking aperture array.
Figure 4:
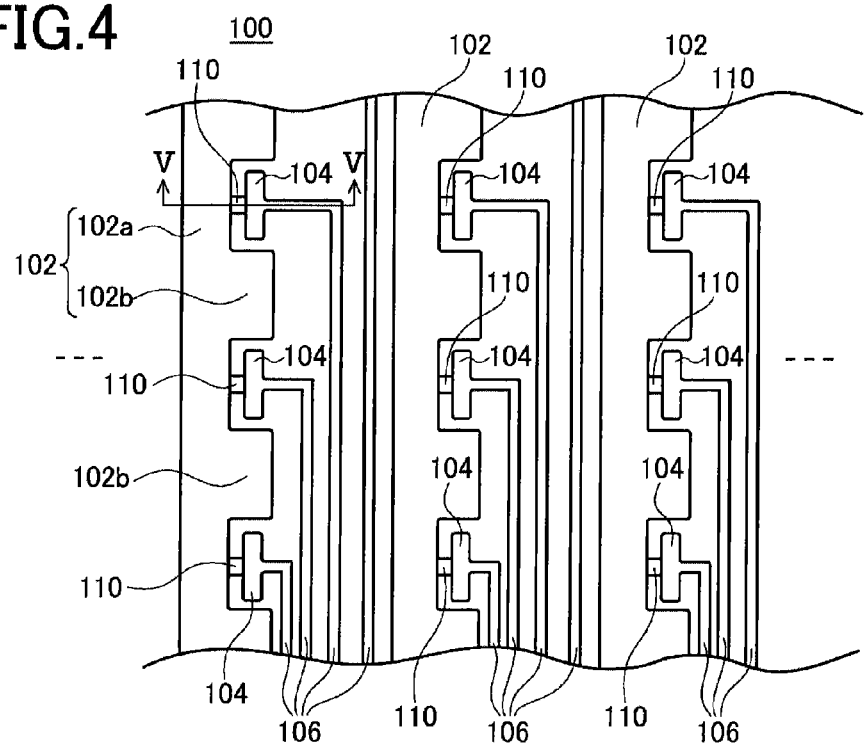
FIG. 4 is a top view of the blanking aperture array.
Figure 5:
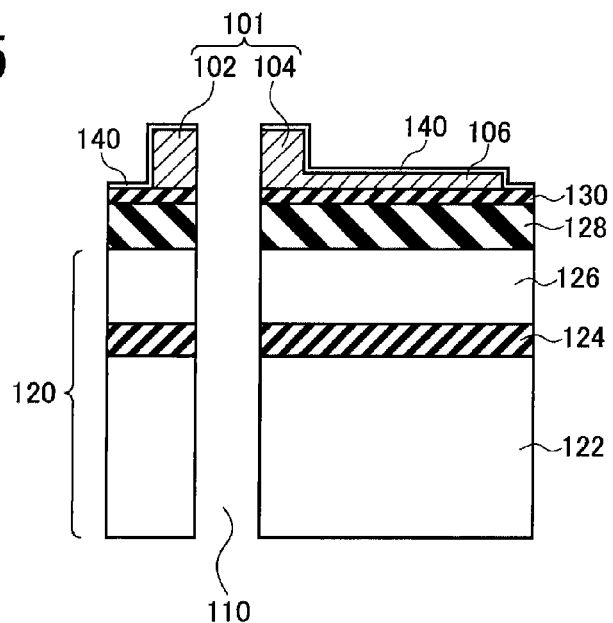
FIG. 5 is a cross-sectional view of the blanking aperture array.

Next, a configuration of the blanking aperture array 10 will be described hereinafter with reference to FIGS. 3 to 5. FIG. 3 is a view schematically illustrating a configuration of the blanking aperture array 10. FIG. 4 is a top view of a penetration hole forming region 100 of the blanking aperture array 10. FIG. 5 is a cross-sectional view taken along line V-V of FIG. 5. In FIG. 4, illustration of a high-resistivity film 140 described below is omitted.

The blanking aperture array 10 includes the penetration hole forming region 100 where a plurality of the penetration holes 110 through which the multi-beams have passed, a control circuit 150 formed around the penetration hole forming region 100, and pads 160. The penetration hole forming region 100, the control circuit 150, and the pads 160 are formed on a substrate 120. The position of the control circuit is not limited to the area around the penetration hole forming region 100. For example, the control circuit 150 may be positioned within a range of not making trouble in producing the blanking aperture array 10. Also, the control circuit 150 may be provided outside the blanking aperture array 10.

In the penetration hole forming region 100 provided in the central part of the substrate 120, a plurality of the penetration holes 110 are arranged in matrix, and the locations of the penetration holes 110 coincide with the locations of the apertures 80 in the aperture member 8. Also, in the penetration hole forming region 100, a plurality of blankers 101 are arranged at each of the penetration holes 110 in matrix. The blanker 101 is a deflector which deflects the beam. Each of the blankers 101 includes a pair of a ground electrode 102 and a blanking electrode 104. The ground electrode 102 and the blanking electrode 104 are placed opposite to each other with the penetration hole 110 between them.

The control circuit 150 receives a blanking control signal from an external control device through a wiring 152, the pad 160, and an external wiring (not shown). Since the wiring 152 is formed when forming a MOSFET, the wiring 152 is formed below a passivation film. The control circuit 150 applies a voltage to the blanking electrode 104 through a blanking wiring 106 and performs blanking deflection based on the received blanking control signal. Circuits of the control circuit 150 are composed of MOS. In the control circuit 150, a COMS inverter is provided as a driver at the final stage. The driver is not limited to the CMOS inverter. The driver may be any one capable of outputting desired voltage based on a control signal.

As shown in FIG. 4, in the penetration hole forming region 100, there are a plurality of ground electrodes 102 extended in the predetermined direction (vertical direction in FIG. 4) at a predetermined interval. For example, a planar shape of the ground electrode 102 is a comb-shape including a straight portion 102a extended in the predetermined direction and a plurality of protruding portions 102b projecting from the straight portion 102a in a direction perpendicular (horizontally) to the extending direction of the straight portion 102a. This structure can prevent leakage of an electric field between electrodes. Between the protruding portions 102b (in a recessed portion of the comb-shape), the blanking electrode 104 is provided. The penetration hole 110 is formed between the straight portion 102a of the ground electrode 102 and the blanking electrode 104.

Between the ground electrodes 102, a plurality of the blanking wirings 106 are extended in parallel with the ground electrode 102. One end of each of the blanking wirings 106 is connected to the control circuit 150. The other end of each of the blanking wirings 106 is bent to the recessed portion of the ground electrode 102, formed in a plane key shape (shape of the letter 'L'), and connected to the blanking electrode 104. The control circuit 150 can apply voltage to the blanking electrode 104 through such the blanking wiring 106.

The ground electrodes 102 also function as ground wirings.

As shown in FIG. 5, the blanking aperture array 10 includes the substrate 120, an interlayer insulating film 128 provided on the substrate 120, and a protective film (passivation film) 130 provided on the interlayer insulating film 128. The substrate 120 is a SOI (Silicon On Insulator) substrate in which a silicon oxide film 124 sandwiched between a silicon substrate 122 and a silicon layer 126. The substrate 120 may be a substrate other than a SOI substrate.

A TEOS (tetraethoxy silane) film can be used as the interlayer insulating film 128. A silicon nitride film can be used as the protective film 130.

In the penetration hole forming region 100, the ground electrode 102 and the blanking electrode 104 are arranged adjacent to the penetration hole 110 to face each other on the protective film 130. The penetration hole 110 penetrates through the protective film 130, the interlayer insulating film 128, and the substrate 120. The blanking wiring 106 connected to the blanking electrode 104 is also provided on the protective film 130.

Outside of the penetration hole forming region 100, a CMOS transistor or the like constituting the control circuit 150 is formed in the silicon layer 126. In addition, a contact portion which connects the blanking wiring 106 on the protective film 130 with the CMOS transistor is formed outside of the penetration hole forming region 100.

The high-resistivity film 140 is formed on surfaces of the ground electrode 102, the blanking electrode 104, the blanking wiring 106, and the protective film 130. n electric resistance value of the high-resistivity film 140 is higher than those of the ground electrode 102, the blanking electrode 104, and the blanking wiring 106. On the other hand, the electric resistance value of the high-resistivity film 140 is lower than those of the protective film 130 and the interlayer insulating film 128.

The electric resistance of the high-resistivity film 140 is fixed at such a level as not to short-circuit the blanking wirings 106, the ground electrodes 102, and the blanking electrodes 104, which are adjacent to the high-resistivity film 140, and as to allow electrons to flow out of the ground electrodes 102 through the high-resistivity film 140 to prevent accumulation of negative charges when the blanking aperture array 10 is irradiated with electron beams.

In order to prevent the blanking wirings 106, the ground electrodes 102, and the blanking electrodes 104, adjacent to the high-resistivity film 140, from being short-circuited, the electric resistance of the high-resistivity film 140 is preferably set higher than or equal to 100 kΩ, more preferably, higher than or equal to 1 MΩ, or further preferably, higher than or equal to 10 MΩ. In order to allow electrons to flow out of the ground electrodes 102 without being accumulated on the high-resistivity film 140, the electric resistance of the high-resistivity film 140 is preferably lower than or equal to 100 MΩ.

Providing the above-described high-resistivity film 140 over at least the protective film 130 and part of the ground electrodes 102 can prevent the surface of the blanking aperture array 10 from being electrically charged. This configuration can thus prevent electrostatic breakdown of the CMOSFET constituting the control circuit 150. This configuration can also prevent changes of the courses of electron beams that pass through the penetration holes 110 and thus can improve the drawing accuracy. In addition, this configuration prevents the blanking wirings 106, the ground electrodes 102, and the blanking electrodes 104, adjacent to the high-resistivity film 140, from being short-circuited even with the high-resistivity film 140 being provided on the blanking electrodes 104 and the blanking wirings 106.

Figure 6:
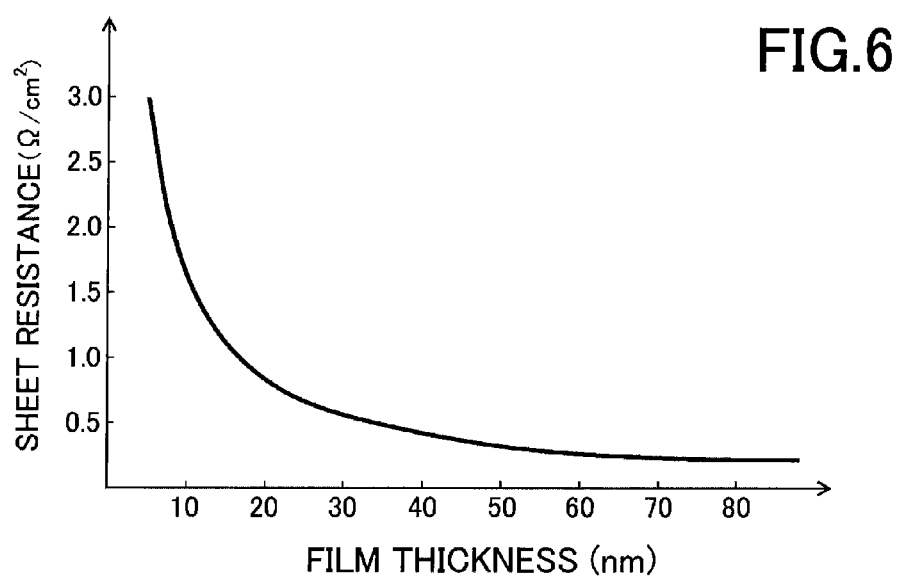
FIG. 6 is a graph showing a relationship between a film thickness and a resistance of a thin silver film.

As the high-resistivity film 140, for example, a metal thin film which comprises Au (gold), Ag (silver), Cu (copper), Fe (iron), Cr (chromium), CrN (chromium nitride), Ti (titanium), TiN (titanium nitride), TaN (tantalum nitride) ,or TiC (titanium carbide) can be used. When the film thickness of the metal thin film is several tens of nm, the electric resistance value of the metal thin film is rapidly increased with reduction in film thickness. As an example, FIG. 6 shows a relationship between a film thickness and a sheet resistance of Ag evaporated film.

As the material of the high-resistivity film 140, CrN is preferable because it can be formed on various materials and has both superior wear resistance and corrosion resistance.

When manufacturing the blanking aperture array 10, firstly, transistors or the like constituting the control circuit 150 are formed in the substrate 120 by known CMOS process. Then, the interlayer insulating film 128 and the protective film 130 are formed. Next, the substrate 120 is etched from the surface and the rear surface of the substrate 120 by known MEMS process to form a plurality of the penetration holes 110.

Next, the ground electrode 102, the blanking electrode 104, and the blanking wiring 106 are formed on the protective film 130 by electroplating of Au or the like.

Figure 7:
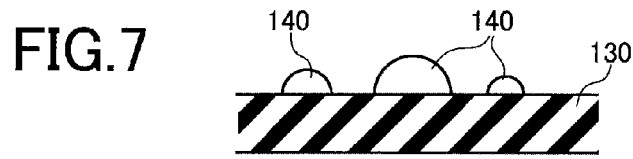
FIG. 7 illustrates a method of forming a high-resistivity film.

Next, the high-resistivity film 140 whose film thickness is 10 nm or less is formed by sputtering. For example, as shown in FIG. 7, the high-resistivity film 140 is grown in island shape. This thin film growing method is also called VW (Volmer Weber) mode. The thin film is grown until the distance between islands becomes about several tens of nm. In this way, the thin high-resistivity film can be formed.

When the high-resistivity film 140 is formed in island shape using CrN, the average thickness of the high-resistivity film 140 measured by the X-ray reflectance method is preferably 10 nm or less, more preferably 5 nm or less, further preferably 3 nm or less. A lower limit of the average thickness is a film thickness for enabling electrons to outflow from the ground electrode 102 through the high-resistivity film 140 without being stored when the electron beam is irradiated.

A formation region of the high-resistivity film 140 has a possibility that the electron beam and/or scattered electrons are irradiated. This is determined based on an electron beam emission angle from the aperture member 8 and a distance between the aperture member 8 and the blanking aperture array 10. The high-resistivity film 140 is formed while a film non-formed region of the blanking aperture array 10 is covered by a protection jig.

In this manner, the high-resistivity film 140 that prevents the surface of the blanking aperture array 10 from being electrically charged and the electrodes or wirings from being short-circuited can be formed in a simple way at low costs.

According to the embodiment, the surface of the blanking aperture array 10 can be prevented from being electrically charged by providing, on the outermost surface of the blanking aperture array 10, the high-resistivity film 140 that has a high electric resistance at such a level that wirings and electrodes adjacent to the high-resistivity film 140 are prevented from being short-circuited and that electrons are allowed to flow out of the ground electrodes 102 without being accumulated. This configuration can prevent electrostatic breakdown of the CMOS transistor constituting the control circuit 150. In addition, this configuration can prevent changes of the courses of electron beams that pass through the penetration holes 110, prevent deviation of irradiation positions or defocus, and enables drawing of patterns with high accuracy.

As illustrated in FIG. 5, the high-resistivity film 140 is formed on side surfaces of the ground electrode 102 and the blanking electrode 104. However, the high-resistivity film 140 may not be formed on the side surfaces of them.

The control circuit 150 may not be formed in the blanking aperture array 10. A circuit portion corresponding to the control circuit 150 may be formed outside the blanking aperture array 10.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A blanking aperture array for a charged particle beam writing apparatus, the blanking aperture array comprising:
    a substrate including an upper surface on which an insulating film is provided;
    a plurality of blanking aperture portions provided in the substrate, each of the plurality of blanking aperture portions including one of penetration holes, through which a predetermined beam passes, and one of blanking electrodes and one of ground electrodes which are provided on the insulating film, and the blanking electrodes and the ground electrodes configured to perform blanking deflection of the predetermined beam; and
    a high-resistivity film provided so as to cover the insulating film and at least part of the ground electrodes, the high-resistivity film having an electric resistance that is higher than an electric resistance of the ground electrodes and lower than an electric resistance of the insulating film.

2. The blanking aperture array according to claim 1, wherein the high-resistivity film is provided so as to cover substantially the whole surface of the substrate.

3. The blanking aperture array according to claim 1, wherein the high-resistivity film is an island-shaped thin film.

4. The blanking aperture array according to claim 1, wherein the electric resistance of the high-resistivity film is higher than or equal to 100 kΩ and lower than or equal to 100 MΩ.

5. The blanking aperture array according to claim 1, wherein the high-resistivity film contains Au, Ag, Cu, Fe, Cr, CrN, Ti, TiN, TaN, or TiC.

6. The blanking aperture array according to claim 1, wherein the high-resistivity film has an average film thickness of less than or equal to 10 nm.

7. The blanking aperture array according to claim 1, wherein the high-resistivity film is provided on an outermost surface of the substrate.

8. The blanking aperture array according to claim 1, wherein the ground electrodes extend in a first direction while being spaced apart from one another, and further comprising;
    blanking wirings each provided between the ground electrodes so as to extend in the first direction, the blanking wirings configured to be connected in one to one correspondence with each of the blanking electrodes.

9. The blanking aperture array according to claim 8, wherein each of the ground electrodes has a comb shape including a straight portion, extending in the first direction, and a plurality of protrusions, protruding from the straight portion in a second direction perpendicular to the first direction,
    wherein each of the blanking electrodes is disposed between each of the protrusions, and
    wherein each of the penetration holes is formed between the straight portion and each of the blanking electrodes.

10. A charged particle beam writing apparatus, comprising:
    a movable stage on which an object is mounted;
    an electron gun that discharges a charged particle beam;
    an aperture including a plurality of openings, the aperture causing part of the charged particle beam to pass through the plurality of openings to form multi-beams;
    a blanking aperture array that performs individual ON/OFF control operations on the corresponding beams of the multi-beams; and
    a deflector that collectively deflects the beams so that each of the beams that has passed through the blanking aperture array is applied to a corresponding irradiation position on the object,
    wherein the blanking aperture array includes:
    a substrate including an upper surface on which an insulating film is provided;
    a plurality of blanking aperture portions provided in the substrate, each of the plurality of blanking aperture portions including each of penetration holes, through which a predetermined beam passes, and each of blanking electrodes and each of ground electrodes which are provided on the insulating film and the blanking electrodes and the ground electrodes configured to perform blanking deflection of the predetermined beam; and
    a high-resistivity film provided so as to cover the insulating film and at least part of the ground electrodes, the high-resistivity film having an electric resistance that is higher than an electric resistance of the ground electrodes and lower than an electric resistance of the insulating film.

11. The apparatus according to claim 10, wherein the high-resistivity film is provided so as to cover substantially the whole surface of the substrate.

12. The apparatus according to claim 10, wherein the high-resistivity film is an island-shaped thin film.

13. The apparatus according to claim 10, wherein the electric resistance of the high-resistivity film is higher than or equal to 100 kΩ and lower than or equal to 100 MΩ.

14. The apparatus according to claim 10, wherein the high-resistivity film contains Au, Ag, Cu, Fe, Cr, CrN, Ti, TiN, TaN, or TiC.

15. The apparatus according to claim 10, wherein the high-resistivity film has an average film thickness of less than or equal to 10 nm.

16. The apparatus according to claim 10, wherein the high-resistivity film is provided on an outermost surface of the substrate.

17. The apparatus according to claim 10, wherein the ground electrodes extend in a first direction while being spaced apart from one another, and further comprising;
   blanking wirings each provided between each of the ground electrodes so as to extend in the first direction, the blanking wirings configured to be connected in one to one correspondence with each of the blanking electrodes.

18. The apparatus according to claim 17,
   wherein each of the ground electrodes has a comb shape including a straight portion, extending in the first direction, and a plurality of protrusions, protruding from the straight portion in a second direction perpendicular to the first direction,
   wherein each of the blanking electrodes is disposed between each of the protrusions, and
   wherein each of the penetration holes is formed between the straight portion and each of the blanking electrodes.

* * * * *